United States Patent [19]

Tehrani

[11] Patent Number: 4,754,880
[45] Date of Patent: Jul. 5, 1988

[54] SURFACE MOUNT ELECTRONIC DEVICE PACKAGE

[75] Inventor: Kazem N. Tehrani, Wichita, Kans.

[73] Assignee: NCR Corporation, Dayton, Ohio

[21] Appl. No.: 103,563

[22] Filed: Oct. 1, 1987

[51] Int. Cl.$^4$ .............................................. B65D 81/02
[52] U.S. Cl. .................................. 206/523; 206/334; 206/588; 206/589
[58] Field of Search ................ 206/334, 492, 521, 523, 206/524, 588, 589, 591, 592, 328, 329; 229/40, 155

[56] References Cited

U.S. PATENT DOCUMENTS

| | | | |
|---|---|---|---|
| 2,849,111 | 8/1958 | Fielding | 229/40 |
| 3,014,636 | 12/1961 | Fielding | 229/40 |
| 3,266,705 | 8/1966 | Wood | 206/521 |
| 3,273,779 | 9/1966 | Mykieby | 206/523 |
| 3,303,893 | 3/1967 | Heffler et al. | 206/523 |
| 4,160,503 | 7/1979 | Ohlbach | 206/328 |
| 4,321,901 | 11/1980 | Berbeco | 206/328 |
| 4,333,565 | 6/1982 | Woods | 206/591 |
| 4,528,222 | 7/1985 | Rzepecki et al. | 206/528 |
| 4,671,453 | 6/1987 | Cassidy | 229/40 |

FOREIGN PATENT DOCUMENTS

| | | | |
|---|---|---|---|
| 1467166 | 12/1966 | France | 206/523 |
| 348356 | 9/1960 | Switzerland | 206/521 |
| 2173174 | 10/1986 | United Kingdom | 206/523 |

OTHER PUBLICATIONS

IBM Technical Disclosure Bulletin, Mar. 1975, vol. 17, No. 10, pp. 2972, 2973, Capousis et al.
Western Electric Technical Digest, No. 15, Jul. 1969, p. 19, Wanesky.

Primary Examiner—David T. Fidei
Attorney, Agent, or Firm—Wilbert Hawk, Jr.; Albert L. Sessler, Jr.; George J. Muckenthaler

[57] ABSTRACT

A package for containing surface mount electronic devices that protects such devices from physical damage during handling and also protects such devices from electrostatic discharge damage. The package includes a plurality of panels supporting a receptacle member, a containing member, and tab members for securing the parts. Two of the panels are swingable to provide an open condition and a closed condition of the package.

11 Claims, 1 Drawing Sheet

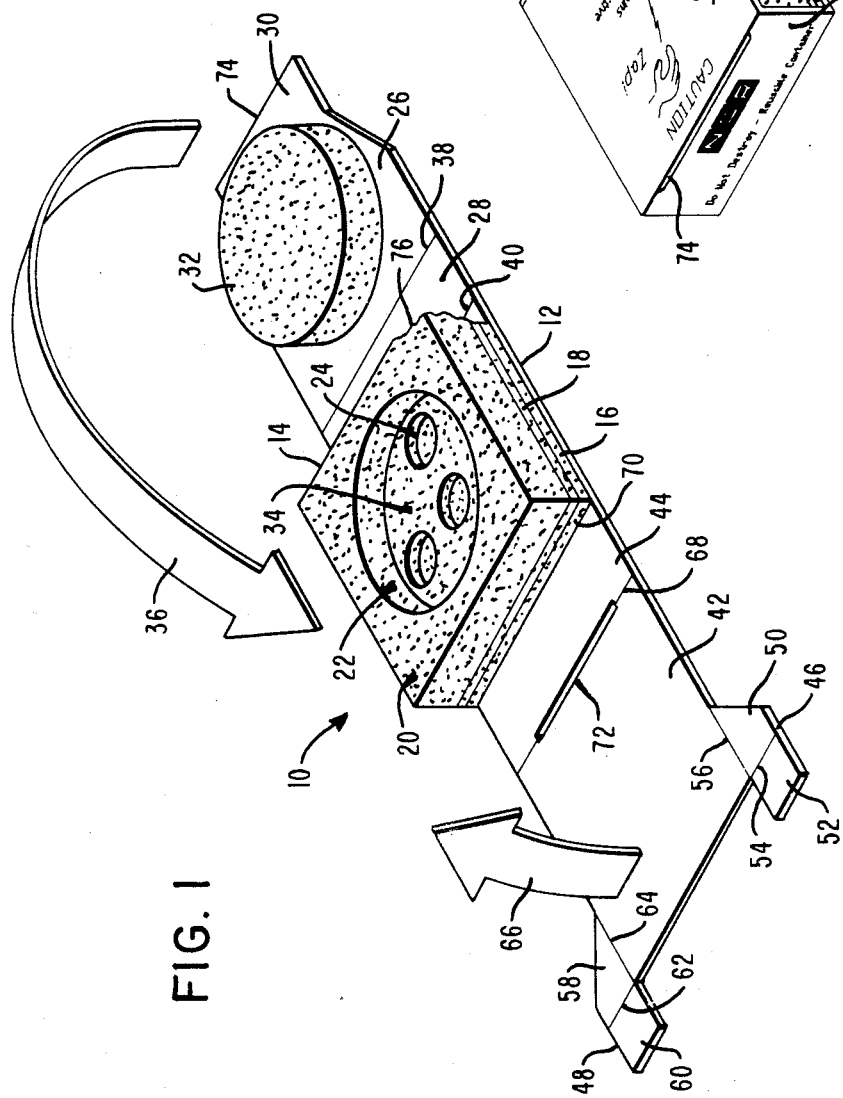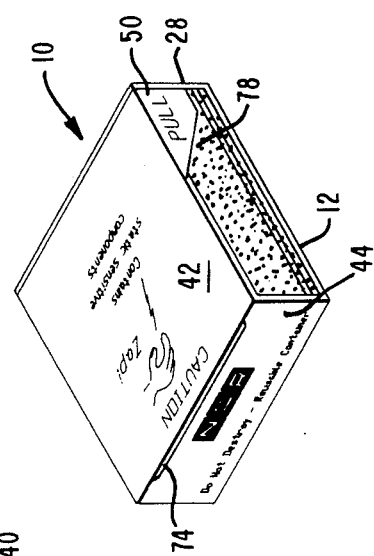

SURFACE MOUNT ELECTRONIC DEVICE PACKAGE

BACKGROUND OF THE INVENTION

In the field of electronic devices, it is well-known that certain devices have been commonly referred to as "bugs" by reason of the peculiar shape and construction of these devices. Such electronic devices may include resistors, capacitors, diodes, transistors, and like elements which make up the "bug" or integrated circuit chip. A common form of chip is rectangular in shape and includes leads or pins that are plugged into holes in a printed circuit board and then secured, as by wave soldering, to maintain the various elements in precise position and to secure the electrical connections.

In the packaging and shipping of these so-called "bug" devices, the pins or leads provide means for insertion into a medium of foam or like insulating material which ensure that the devices are secure against accidental contact with another device or even becoming loose in the package.

With the advent of surface mount technology, the surface mount devices do not have the leads or pins to enable use of the pins for securing the devices during packaging and shipment. The surface mount devices are formed with substantially smooth or flat surfaces and therefore require a unique method for packaging such devices.

Representative means for packaging and shipping such surface mount devices have included clear plastic tubes wherein the devices are stacked against each other and a foam rubber or like element is provided at each end of the tube to provide resilient means and prevent physical damage of the devices.

Other means for packaging such devices have included trays having individual plastic cup similar to those used in boxes of chocolate candy for containing individual devices.

A further means for holding and containing the devices may be the use of a taped reel for such devices.

SUMMARY OF THE INVENTION

The present invention relates to means for packaging electronic devices. More particularly, the invention relates to a receptacle in the form of a package for receiving one or more electronic devices of the surface mount type. The package includes an elongated, generally rectangular member having three major portions or panels of sheet material, the central one of which provides a support or base for a receptacle that holds one or more electronic devices. An adjacent portion or panel provides a support for an insert which is received into the receptacle, and an opposite adjacent portion or panel provides a cover for the insert support and includes tab portions for securing the cover.

The receptacle is essentially square in shape and is secured to the central panel as by means of adhesive or the like. The receptacle is made of foam-like, synthetic material and includes a well with one or more recesses in the bottom thereof for the surface mount devices.

The insert is circularly shaped and is secured to the panel by adhesive or the like, the insert panel being somewhat irregular in shape and having a narrowed portion for cooperating with the cover panel.

The cover panel is essentially square in shape but includes tabs at two corners thereof which are inserted into respective spaces formed by a wall portion of the receptacle and a connecting portion of the insert panel.

When the surface mount devices are placed in the recesses in the well of the receptacle, the insert panel is folded to place the insert into the well of the receptacle, the cover is folded over the insert panel, and the tabs are locked into the spaces provided by the wall of the receptacle and a side or connecting wall portion of the insert panel.

In accordance with the above discussion, a principal object of the present invention is to provide means for holding one or more surface mount electronic devices.

Another object of the present invention is to provide a package for holding such electronic devices in a manner to prevent damage thereto.

An additional object of the present invention is to provide a package for holding such electronic devices wherein each of such devices is isolated from another so as to protect the devices from damage in handling and shipping thereof.

A further object of the present invention is to provide a foldable package having a plurality of panels that carry a receptacle for the electronic devices, an insert for keeping the devices in the receptacle, and a cover for securing the insert panel.

Additional advantages and features of the present invention will become apparent and fully understood from a reading of the following description taken together with the annexed drawing.

BRIEF DESCRIPTION OF THE DRAWING

FIG. 1 is a perspective view of the package incorporating the subject matter of the present invention and showing the package in an open condition; and FIG. 2 is a perspective view of the package in a closed condition.

DESCRIPTION OF THE PREFERRED EMBODIMENT

Referring to the drawing, FIG. 1 illustrates the structure of the present invention wherein the package 10 is in an open condition. The package 10 includes three major portions or panels of sheet material, of different shapes, to provide different functions for the practice of the invention.

A central panel 12, about two inches by two inches in the illustrated embodiment, provides a support or base for a receptacle 14 of foam-like material. The receptacle 14 is made up of a layer 16 of such foam-like material which is attached to the panel 12 by adhesive means, a layer 18 of such foam-like material that is attached to the layer 16, and a top portion 20 that includes an aperture 22 therethrough. The layer 16 is generally solid in form whereas the layer 18 includes one or more apertures 24 therethrough, the apertures providing recesses or cups formed to receive a respective surface mount device. While FIG. 1 shows only three apertures 24 of the preferred pattern of five, other patterns may be used in the practice of the invention. The aperture 22 in the top portion 20 provides a well for enabling easy placement of the surface mount devices into the several apertures 24 which form the recesses or cups for the devices.

A right side panel 26, as oriented in the open condition of FIG. 1, is connected to the central panel 12 by means of a connecting portion 28. The panel 26 is of irregular shape and has an outer portion 30 that is narrowed for a purpose to be described. The panel 26 provides a base or support for a disk-like insert or plug 32 that is attached to the panel 26 by adhesive means or the like. The insert 32 is sized to fit into the aperture 22 of the top portion 20 and to seat on the surface 34 of the layer 18, when the panel 26 is folded or swung in the direction indicated by the arrow 36. A fold line 38 is provided at the junction of the right side panel 26 and the connecting portion 28, and a fold line 40 is provided at the junction of the connecting portion 28 and the central panel 12. When the right side panel 26 is folded over to place the insert 32 into the aperture 22 of the top portion 20, the connecting portion 28 serves as a wall on one side of the receptacle 14 (FIG. 2).

A left side panel 42, as oriented in the open condition of FIG. 1, is connected to the central panel 12 by means of a connecting portion 44. The panel 42 is essentially square in shape and has a pair of tabs, 46 and 48, as an integral part thereof for securing the package. The tab 46 has an angular portion 50 and a square portion 52. A fold line 54 is provided at the junction of the portions 50 and 52, and a fold line 56 is provided at the junction of the portion 50 and the panel 42. Similarly, the tab 48 has an angular portion 58 and a square portion 60. A fold line 62 is provided at the junction of the portions 58 and 60, and a fold line 64 is provided at the junction of the portion 58 and the panel 42.

The left side panel 42 provides a cover over the top of the insert panel 26 when the panel 42 is folded or swung in the direction of the arrow 66. A fold line 68 is provided at the junction of the panel 42 and the connecting portion 44, and a fold line 70 is provided at the junction of the connecting portion 44 and the central panel 12. The fold line 68 has a slot 72 for a distance therealong to receive an edge portion 74 (see also FIG. 2) of the outer portion 30 of the insert panel 26. When the panel 26 is swung, as indicated by the arrow 36, and when the panel 42 is swung, as indicated by the arrow 66, to effect a closed condition of the package 10, the edge portion 74 enters the slot 72 to secure the parts (FIG. 2). Also, when the left side panel 42 is folded over to place the tabs 46, 48 into the locking position, the connecting portion 44 serves as a wall on the other side of the receptacle 14 (FIG. 2). It is, of course, seen that the tabs 46 and 48 would be adequate to secure the parts in a modified arrangement of the package and without the use of the edge portion 74-slot 72 structure.

Additionally, when the panels 26 and 42 are swung to the closed condition, the square portion 52 of tab 46 is folded at line 54 and such portion is inserted into the space between the connecting portion 28 and the side 76 (FIG. 1) of the receptacle 14, while, at the same time, the tab portion 50 is folded at line 56 to place such portion 50 against the side 78 (FIG. 2).

Likewise, the square portion 60 of tab 48 is folded at line 62 and such portion is inserted into the space between the connecting portion 28 and the side 76 (FIG. 1) of the receptacle 14 at the opposite corner thereof, while, at the same time, the tab portion 58 is folded at line 64 to place such portion 58 against the side of the receptacle 14 which is opposite the side 78.

When it is desired to open the package, the tabs 50 and 58 are pulled from the respective sides of the receptacle 14 which action swings the tabs upwardly and removes the tabs 52 and 60 from the space between the connecting portion 28 and the wall 76 of the receptacle 14.

The package 10 is designed to prevent physical damage to the surface mount devices while they are being handled and/or shipped. The present design provides protection from physical damage during handling by reason of the structure of the package, and the design also provides protection from electrostatic discharge damage by reason of materials used in the package. The receptacle means and the insert means comprise cooperating members of anti-static foam-like material. The preferred materials used in the package are 1.6 pound polyether urethane for the receptacle 14 and the insert 32, and 71 pound conductive solid fiber liner for the three panels 12, 26 and 42 and their associated portions.

It is thus seen that herein shown and described is a package for surface mount devices that protects such devices from physical damage and from static discharge damage. The package of the present invention enables the accomplishment of the objects and advantages mentioned above, and while a preferred embodiment has been disclosed herein, variations thereof may occur to those skilled in the art. It is contemplated that all such variations not departing from the spirit and scope of the invention hereof are to be construed in accordance with the following claims.

I claim:

1. A package for containing surface mount electronic devices comprising a
   first panel,
   receptacle means attached to said first panel and comprising a first layer of foam-like material attached to said first panel, a second layer of foam-like material attached to the first layer and including a plurality of spaced apertures therethrough for holding a like plurality of said electronic devices, and a third layer of foam-like material attached to the second layer and having an aperture therethrough,
   first connecting means connected to said first panel along a first fold line, a
   second panel connected to said first connecting means along a second fold line parallel to the first fold line,
   insert means attached to said second panel, said second panel being swingable to allow said aperture in said third layer of said receptacle means to receive said insert means for containing said electronic devices in position in said plurality of spaced apertures,
   second connecting means connected to said first panel along a third fold line parallel to the first and second fold lines, and a
   third panel connected to said second connecting means along a fourth fold line parallel to the third fold line, said third panel being swingable to cover said second panel, and said third panel having means for coupling the third panel with said second panel to provide a secured package.

2. The package of claim 1 wherein said first panel comprises a sheet-like member for supporting said receptacle means.

3. The package of claim 1 wherein said second panel comprises a sheet-like member for supporting said insert means.

4. The package of claim 1 wherein said insert means comprises a circular-shaped foam-like member operably associated with and fitting into the aperture of said third layer of said receptacle means for containing said plurality of electronic devices.

5. The package of claim 1 wherein said third panel comprises a sheet-like member and includes at least one tab portion for coupling with said second portion.

6. The package of claim 1 wherein the first connecting means forms a first wall for said receptacle means when said second panel is swung to allow said receptacle means to receive said insert means.

7. The package of claim 1 wherein the second connecting means forms a second wall for said receptacle means when said third panel is swung to cover said second panel.

8. The package of claim 1 wherein said second panel includes an edge portion and said third panel includes slot means for receiving said edge portion when said third panel is swung to cover said second panel.

9. The package of claim 1 wherein the receptacle means and the insert means comprise cooperating members of anti-static foam-like material.

10. The package of claim 1 wherein the first, second and third panels comprise sheet-like members of conductive fiber material.

11. The package of claim 1 wherein the receptacle means and the insert means comprise cooperating members of polyether urethane material.

* * * * *